United States Patent [19]
Hunter et al.

[11] Patent Number: 5,748,645
[45] Date of Patent: May 5, 1998

[54] CLOCK SCAN DESIGN FROM SIZZLE GLOBAL CLOCK AND METHOD THEREFOR

[75] Inventors: Craig C. Hunter; Russell A. Reininger, both of Austin, Tex.

[73] Assignee: Motorola, Inc., Schaumburg, Ill.

[21] Appl. No.: 654,981

[22] Filed: May 29, 1996

[51] Int. Cl.⁶ .................................................. G01R 31/28
[52] U.S. Cl. .................................... 371/22.31; 371/22.36
[58] Field of Search ........................... 371/22.31, 22.1, 371/22.2, 27.7, 22.32, 22.34, 22.36; 364/270, 270.2, 270.3, 270.4

[56] References Cited

U.S. PATENT DOCUMENTS

| | | | |
|---|---|---|---|
| 5,206,861 | 4/1993 | Hannon et al. | 371/22.3 |
| 5,349,587 | 9/1994 | Dostie et al. | 371/22.3 |
| 5,392,296 | 2/1995 | Suzuki | 371/22.3 |
| 5,394,403 | 2/1995 | Klein | 371/21.1 |
| 5,412,663 | 5/1995 | Kromer et al. | 371/22.1 |
| 5,524,114 | 6/1996 | Peng | 371/22.1 |
| 5,528,306 | 6/1996 | Itoh | 348/453 |
| 5,530,677 | 6/1996 | Grover et al. | 365/233 |

*Primary Examiner*—Hoa T. Nguyen

[57] ABSTRACT

A scan based test methodology generates conventional functional clocks (CLK1 and CLK2) and test clocks (CLKA and CLKB) from a single input clock (GCLK). The methodology allows an integrated circuit (10) designed according to it to be tested at the part's operating frequency. Also, the test methodology is compatible with known test methodologies such as level sensitive scan design ("LSSD"). The pre-existing body of test programs and equipment can be used with a circuit incorporating the invention. The single clock requirement also simplifies design.

8 Claims, 3 Drawing Sheets

94

CLOCK SCAN DESIGN FROM SIZZLE GLOBAL CLOCK AND METHOD THEREFOR

FIELD OF THE INVENTION

The present invention relates, in general, to digital electronic circuits and more particularly to an apparatus and method for testing said circuits.

BACKGROUND OF THE INVENTION

Device density and circuit functionality are the twin touchstones of the semiconductor industry. The combination of these two criteria are driving the industry to create each new generation of products which are smaller, faster, more functional and less expensive than the prior generation. Unfortunately, these two goals are in opposition to a third, equally important measure—manufacturing testability. No product, however small, fast or functional, can be marketed if the product can not be expected to operate as designed. As products get smaller, faster, and more functional, the number of parameters to be tested increases. And, each parameter becomes more inconvenient to test.

One approach to testing clocked circuits or portions of clocked circuits is by creating scan chains. Sequential circuits may be difficult to test because they are difficult to isolate either functionally or physically from other circuits. Also, sequential circuits may contain memory elements which make them hard to test completely. One type of circuit used to test sequential circuits incorporates scan chains is known as level-sensitive scan design ("LSSD") circuit. In an LSSD circuit, each latch receives two inputs. The first input receives the normal functional data as required by the operation of the latch. The second input receives the output from some other latch which is typically located nearby, a SCAN IN input. A certain number of these latches are combined in this way to create one or more scan chains. The inputs to the first latch and the outputs of the last latch in each of the scan chains are connected to the circuit's external pins. During testing, test stimulus data is shifted into the each latch in the scan chains. The circuit is then configured to operate normally and the machine state advanced one or more clock cycles. Finally, the LSSD circuit is configured back into the test mode and the test response data stored in the chains latches is shifted out, typically as new test stimulus data is shifted in. The shift response data is compared with the expected data to verify the proper operation of the circuit.

Although the LSSD methodology provides a reliable means for testing and debugging a broad range of very large scale integrated (VLSI) components, it has several limitations. For instance, LSSD methodologies require at least two independent clocking signals to function. One clock, typically referred to as a "global clock" or GCLK is distributed throughout a circuit for the functional clocking of synchronous circuits. This GCLK is further separated into two non-overlapping clocks for separately capturing and launching functional data to and from a master-slave style latch. These two derivatives of GCLK are often referred to as CLK1 and CLK2 or C1 and C2. A second clock controls test operations. This test clock is also separated into non-overlapping clocks for separately capturing and launching scan data to and from a master-slave style latch. These two derivatives of the test clock are often referred to as CLKA and CLKB or ACLK and BCLK. Further, CLKA and CLKB must be independent of each other in the LSSD methodology. In many methodologies, CLKA and CLKB are two separate signals, requiring two interconnect systems.

The additional clocking signal in an LSSD design requires space on the digital circuit thereby increasing cost, complexity, or both. Because of the expense involved in routing two clocking signals throughout an integrated circuit, the test clock is typically routed without concern for its variation or "skew" across the device. Conversely, the functional clock signal is routed with great care to maximize the operating frequency of the circuit given a particular manufacturing technology. The test clock skew compromise prevents the integrated circuit from operating in test mode at the same frequency as it operates in functional mode. Consequently, an LSSD compliant circuit requires a relatively long time to be tested, reducing post-manufacture throughput.

BRIEF DESCRIPTION OF THE DRAWINGS

The features and advantages of the present invention will be more clearly understood from the following detailed description taken in conjunction with the accompanying FIGURES where like numerals refer to like in corresponding parts and in which.

DETAILED DESCRIPTION OF A PREFERRED EMBODIMENT

Figure 1:
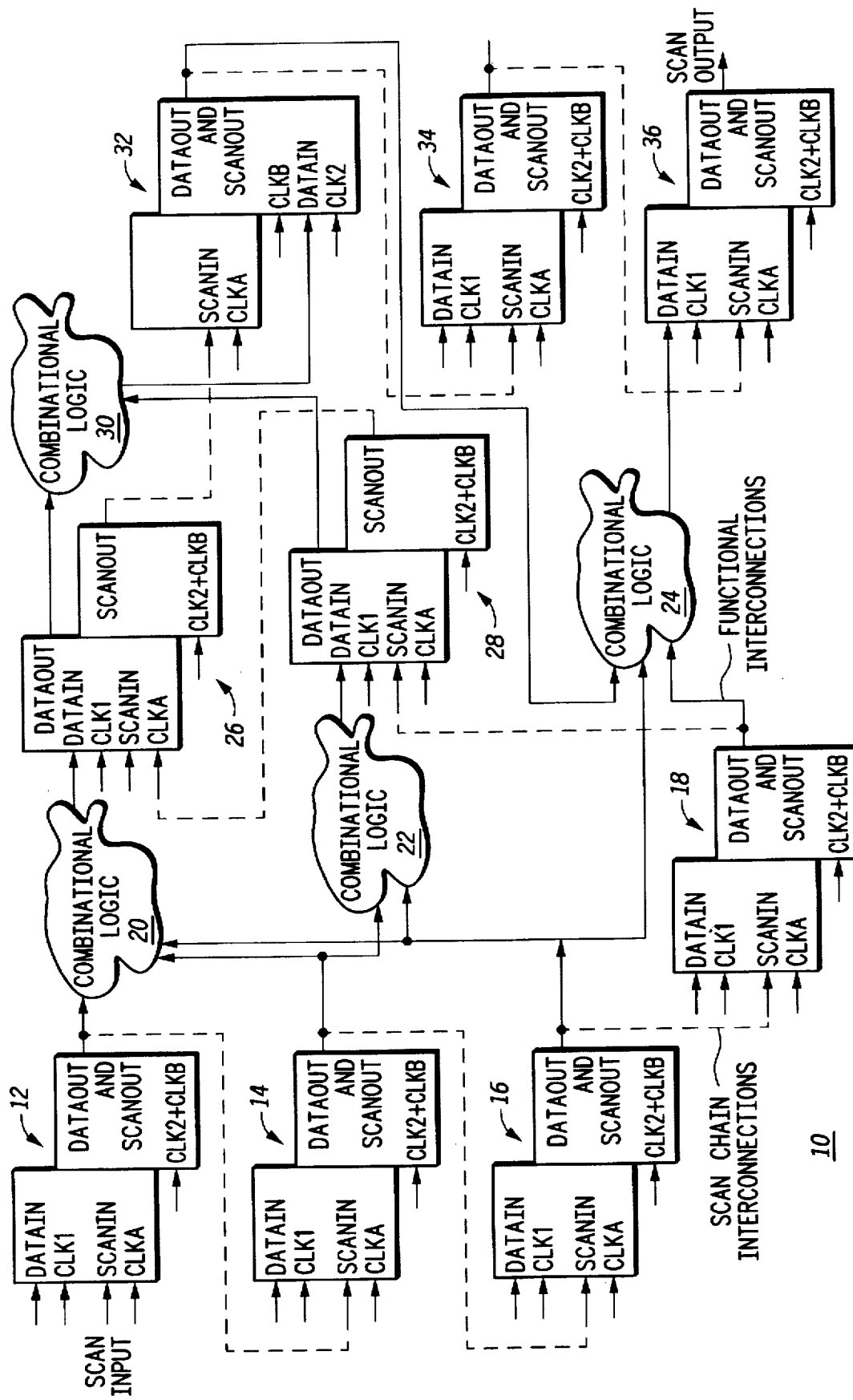
FIG. 1 depicts a block diagram of a portion of an integrated circuit constructed in accordance with the present invention.

FIG. 1 depicts a block diagram of a portion of an integrated circuit 10 constructed in accordance with the present invention. Integrated circuit 10 is designed according to a single clock scan design (SSD) that allows a high degree of testability after manufacture. The SSD methodology requires but a single clock to be routed to clock regenerators (depicted in FIGS. 5 and 6) and ultimately to the various latches of integrated circuit 10. This SSD methodology reduces the complexity and size of integrated circuit 10 and allows integrated circuit 10 to be tested at full speed. As described in the Background of the Invention, a single clock requires less area on an integrated circuit to route than does the combination of a functional clock and a test clock. Also, the single clock of integrated circuit 10 is routed to ensure that each portion of integrated circuit 10 receives the single clock with the same skew. Since this clock is also used for SSD testing, each portion of integrated circuit 10 receives the test clock with the same skew. Therefore, integrated circuit 10 can be tested at the same clock speed at which it is designed to be operated. Reduced testing time increases manufacturing throughput and ultimately decreases cost. The disclosed SSD system is also able to emulate a level sensitive scan design (LSSD) methodology. Pre-existing test routines developed for this popular methodology can be used with the present invention.

Continuing with FIG. 1, a first latch 12, a second latch 14, a third latch 16, and a fourth latch 18 receive four single bit data inputs at their DATAIN inputs. The DATAOUT outputs of first latch 12 and second latch 14 are coupled to two inputs of a combinatorial logic block 20. Similarly, the DATAOUT output of second latch 14 and the DATAOUT output of third latch 16 are coupled to two inputs of a combinatorial logic block 22. Finally, the DATAOUT output of third latch 16 and the DATAOUT output of fourth latch 18 are coupled to two inputs of a combinatorial logic block 24. The output of combinatorial logic block 20 and combinatorial logic block 22 are coupled to the data inputs of a fifth latch 26 and a sixth latch 28, respectively. The DATAOUT outputs of fifth latch 26 and sixth latch 28 are coupled to the inputs of a combinatorial logic block 30. An output of combinatorial logic block 30 is connected to the data input of a seventh latch 32. A data output of seventh latch 32 is coupled to combinatorial logic block 24. A first output of combinatorial logic block 24 is coupled to the data input of an eighth latch 34 and a ninth latch 36, respectively. Combinatorial logic blocks 20, 22, 24, and 30 are typically comprised of NAND gates, NOR gates, inverters, etc. as required by the specified function of integrated circuit 10.

First latch 12, second latch 14, third latch 16, fourth latch 18, eighth latch 34 and ninth latch 36 each receive three clock signals, CLK1, CLK2+CLKB (pronounced "clock-2-or-clock-B"), and CLKA. CLK2+CLKB is the logical OR combination of two clock signals CLK2 and CLKB. First latch 12, second latch 14, third latch 16, eighth latch 34 and ninth latch 36 are described below in connection with FIG. 2.

Fifth latch 26 and sixth latch 28 each receive three clock signals, CLK1, CLK2+CLKB, and CLKA. Fifth latch 26 and sixth latch 28 are described below in connection with FIG. 3.

Seventh latch 32 receives three clock signals, CLK2, CLKB, and CLKA. Seventh latch 32 is described below in connection with FIG. 4.

There is a second connective path in integrated circuit 10 depicted by the dashed line. This second path depicts a scan chain used for testing integrated circuit 10. In particular, an initial scan input is coupled to a SCANIN input of first latch 12. The data output of first latch 12 itself is coupled to the SCANIN input of second latch 14. This scan path proceeds in a similar manner from second latch 14 to third latch 16, to fourth latch 18, to sixth latch 28, to fifth latch 26, to seventh latch 32, to eighth latch 34, and finally to ninth latch 36. A final scan output is generated by a data output DATAOUT output of first latch 12. The SCAN INPUT and SCAN OUTPUT may be connected to user accessible ports or to other scan chains.

As described, latches 12, 14, 16, 18, 26, 28, 32, 34, and 36 each comprise a first or master portion and a second or slave portion. In certain other references, these latches are referred to as master-slave latches, flip-flops, shift register latches (SRLs), etc.

The operation of integrated circuit 10 may be conveniently described with respect to its two modes of operation: functional mode and test mode. Furthermore, the test mode of operation may be subdivided into a shiftin/shift-out sub-mode and a test operation sub-mode.

Continuing with the functional mode of operation, first latch 12, second latch 14, third latch 16, fourth latch 18, eighth latch 34 and ninth latch 36 each capture the logic value present on their respective inputs DATAIN upon the assertion of the clock signal CLK1. The input logic values to first latch 12, second latch 14, third latch 16, and fourth latch are generated by circuitry (not shown). The input logic values to eighth latch 34 and ninth latch 36 are generated by combinatorial logic block 24. These same latches output the captured data upon the assertion the clock signal CLK2+CLKB. First latch 12, second latch 14, third latch 16, fourth latch 18, eighth latch 34, and ninth latch 36 are referred to as L1/L2 (pronounced L-one-L-two) latches. As depicted in FIG. 1, the outputs of first latch 12, second latch 14, third latch 16, and fourth latch 18 are input to combinatorial logic blocks 20, 22, and 24 where they are processed as required by the particular operation of integrated circuit 10. The outputs of eighth latch 34 and ninth latch 36 are input to other circuitry (not shown).

Fifth latch 26 and sixth latch 28 each also capture the logic value present on their respective inputs DATAIN upon the assertion of the clock signal CLK1. The input logic values to fifth latch 26 and sixth latch 28 are generated by combinatorial logic blocks 20 and 22. These two latches output the captured data upon the same assertion of the clock signal CLK1. These two latches output their captured data via the SCAN OUT output upon the assertion the clock signal CLK2+CLKB. Fifth latch 26 and sixth latch 28 are referred to as L1* (pronounced L-one-star) latches. These latches capture and forward data in a single CLK1 pulse. As depicted in FIG. 1, the outputs of fifth latch 26 and sixth latch 28 are input to combinatorial logic blocks 30 where they are processed as required by the particular operation of integrated circuit 10.

Seventh latch 32 captures the logic value present on its DATAIN input upon the assertion of the clock signal CLK2. The input logic value to seventh latch 32 is generated by combinatorial logic blocks 30. Seventh latch 32 outputs its captured data upon the same assertion of the clock signal CLK2. This latch outputs its captured data via the DATA OUT output upon the assertion the clock signal CLK2+CLKB. Seventh latch 32 is referred to as a *L2 (pronounced star-L-two) latch. This type of latch captures and forwards data in a single CLK2 pulse. As depicted in FIG. 1, the output of seventh latch 32 are input to combinatorial logic block 24 where it is processed as required by the particular operation of integrated circuit 10.

For timing coherency reasons, L1* latches and *L2 latches are always used in pairs to generate a whole clock cycle delay.

Testing involves two steps: (1) shifting in test stimulus data to integrated circuit 10, and (2) applying the test stimulus data to the various portions of integrated circuit 10 and capturing the test response data. Later, the test response data is scanned out of integrated circuit 10 while a next test vector is scanned in through the same path.

During shift in, a 9-bit test stimulus is input to first latch 12, second latch 14, third latch 16, fourth latch 18, fifth latch 26, sixth latch 28, seventh latch 32, eighth latch 34, and ninth latch 3 via the scan path depicted by the dashed line. These 9-bits are shifted serially one bit at a time into integrated circuit 10; progressing through one latch for each pulse of CLKA and CLK2+CLKB or CLKB. Each bit is also simultaneously applied to the data output DATA OUT of each latch. Eventually, the last six bits of this 9-bit test stimulus are applied to combinatorial logic blocks 20, 22, 24, and 32 by the data outputs DATA OUT of first latch 12, second latch 14, third latch 16, fourth latch 18, fifth latch 26, and sixth latch 28. The first three bits of this 9-bit test stimulus are applied to circuitry downstream of the circuitry depicted in FIG. 1 (not shown) by seventh latch 32, eighth latch 34, and ninth latch 36. Combinatorial logic blocks 20, 22, 24, and 30 will generate outputs as required by the function of integrated circuit 10 given the test stimulus.

The test response data generated by the test stimulus data is captured by pulsing CLK1 and CLK2+CLKB or CLKB. Fifth latch 26, sixth latch 28, seventh latch 32, eighth latch 34, and ninth latch 36 will latch the four bits output by combinatorial logic blocks 20, 22, 24, and 32. First latch 12, second latch 14, third latch 16, and fourth latch 18 will capture test response data generated by circuitry upstream of the circuitry depicted in FIG. 1 (not shown).

As described above, the test response data is scanned out of integrated circuit 10 while another test vector is scanned in through the same path.

Figure 2:
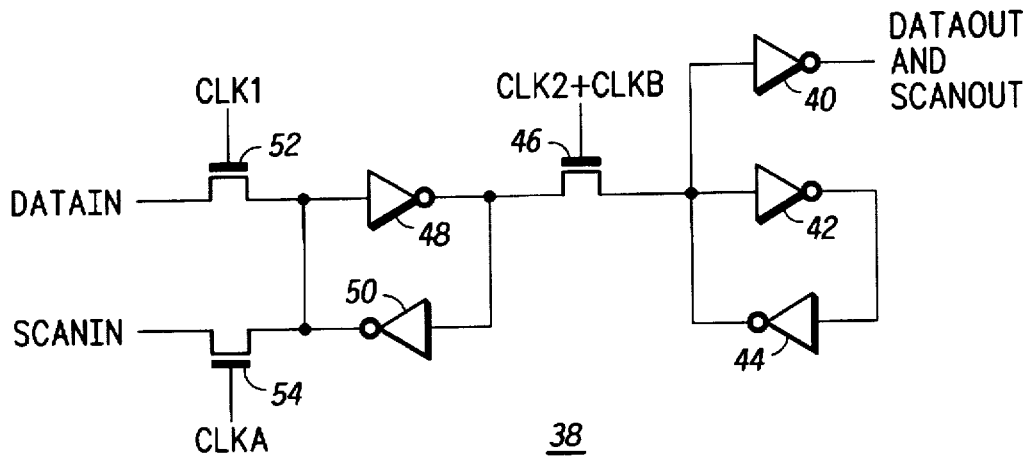
FIG. 2 depicts a schematic diagram of a first class of latch illustrated in FIG. 1.

FIG. 2 depicts a schematic diagram of a first class of latch 38 illustrated in FIG. 1. As described above, this first class of latch is referred to as an L1/L2 latch. First latch 12, second latch 14, third latch 16, fourth latch 18, eighth latch 34, and ninth latch 36 are examples of this class of latch. The data output DATA OUT and scan output SCAN OUT are generated by an output of an inverter 40. An input of inverter 40 is connected to an input of an inverter 42 and to an output of an inverter 44. An output of inverter 42 is connected to an input of inverter 44. The input of inverter 40 is also connected to a first current electrode of an N-type transistor 46. A control electrode of N-type transistor 46 receives the clock signal CLK2+CLKB. A second current electrode of N-type transistor 46 is connected to an output of an inverter 48 and to an input of an inverter 50. An input of inverter 48 and an output of inverter 50 are connected together, to a first current electrode of an N-type transistor 52, and to a first current electrode of an N-type transistor 54. A control electrode of N-type transistor 52 receives the clock signal CLK1. A second current electrode of N-type transistor 52 receives the data input DATA IN. A control electrode of N-type transistor 54 receives the clock signal CLKA. A second current electrode of N-type transistor 54 receives the scan input SCAN IN.

Figure 3:
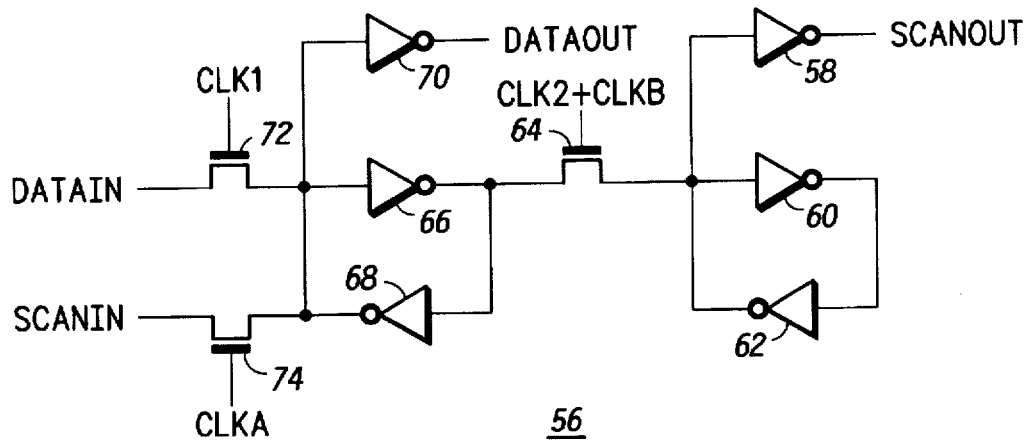
FIG. 3 depicts a schematic diagram of a second class of latch illustrated in FIG. 1.

FIG. 3 depicts a schematic diagram of a second class of latch 56 illustrated in FIG. 1. As described above, this second class of latch 56 is referred to as an L1* latch. Fifth latch 26 and sixth latch 28 are examples of this class of latch. The scan output SCAN OUT is generated by an output of an inverter 58. An input of inverter 58 is connected to an input of an inverter 60 and to an output of an inverter 62. An output of inverter 60 is connected to an input of inverter 62. The input of inverter 58 is also connected to a first current electrode of an N-type transistor 64. A control electrode of N-type transistor 64 receives the clock signal CLK2+CLKB. A second current electrode of N-type transistor 64 is connected to an output of an inverter 66 and to an input of an inverter 68. An input of inverter 66 and an output of inverter 68 are connected together, to an input of an inverter 70, to a first current electrode of an N-type transistor 72, and to a first current electrode of an N-type transistor 74. An output of inverter 70 generates the data output DATA OUT. A control electrode of N-type transistor 72 receives the clock signal CLK1. A second current electrode of N-type transistor 72 receives the data input DATA IN. A control electrode of N-type transistor 74 receives the clock signal CLKA. A second current electrode of N-type transistor 74 receives the scan input SCAN IN.

Figure 4:
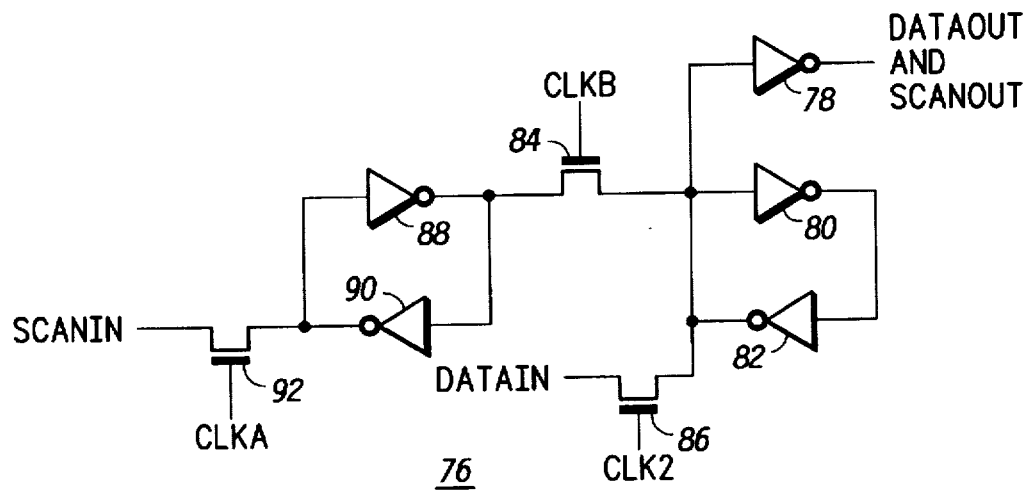
FIG. 4 depicts a schematic diagram of a third class of latch illustrated in FIG. 1.

FIG. 4 depicts a schematic diagram of a third class of latch 76 illustrated in FIG. 1. As described above, this third class of latch 76 is referred to as an *L2 latch. Seventh latch 32 is an example of this class of latch. The data output DATA OUT and scan output SCAN OUT are generated by an output of an inverter 78. An input of inverter 78 is connected to an input of an inverter 80 and to an output of an inverter 82. An output of inverter 80 is connected to an input of inverter 82. The input of inverter 78 is also connected to a first current electrode of an N-type transistor 84 and to a first current electrode of an N-type transistor 86. A control electrode of N-type transistor 84 receives the clock signal CLKB. A control electrode of N-type transistor 86 receives the clock signal CLK2. A second current electrode of N-type transistor 86 receives the data input DATA IN. A second current electrode of N-type transistor 84 is connected to an output of an inverter 88 and to an input of an inverter 90. An input of inverter 88 and an output of inverter 90 are connected together and to a first current electrode of an N-type transistor 92. A control electrode of N-type transistor 92 receives the clock signal CLKA. A second current electrode of N-type transistor 92 receives the scan input SCAN IN.

According to known testing methodologies, it is desirable to generate four clock signals for functionally operating and testing a circuit: CLK1, CLK2, CLKA, and CLKB. The master portion of each latch captures the logic value input on the DATAIN or on the SCANIN inputs when the clock signals CLK1 or CLKA correspond to a high logic value, respectively. Both clock signals are never asserted simultaneously. Otherwise, each master portion maintains its previous state. The slave portion of each latch captures the logic value output from its associated master portion or from the SCANIN input when the clock signals CLK2 or CLKB correspond to a high logic value, respectively. Again, both clock signals are never asserted simultaneously.

As described above, it is known in the art to generate the four clock signals CLK1, CLK2, CLKA, and CLKB with two clock signals and multiple control signals used for gating the clock signals in the various modes of operation. Typically, CLK1 and CLK2 are generated from the two phases of a single global clock. However, CLKA and CLKB are independent of each other and, therefore, are routed as two separate signals. In all, known test methodologies require three clock signals. The design expense of controlling the skew of three clock signals is prohibitive. Consequently, only the global clocking signals is routed with concern for its skew. The skew of CLKA and CLKB limit the frequency at which known circuits can be tested. However, significant test routines have been developed for this known three/four clock methodology. Therefore it is advantageous to be able to emulate the known methodology's functionality to capture the existing test infrastructure.

The disclosed invention emulates much of the functionality of known three/four clock methodologies. Therefore, the disclosed invention is compatible with existing test programs and equipment. However, the disclosed invention uses one clock signal to generate its various clocking signals. The use of a single clock signal allows a circuit incorporating the invention to be test at the frequency at which the circuit was designed to operate.

Figure 5:
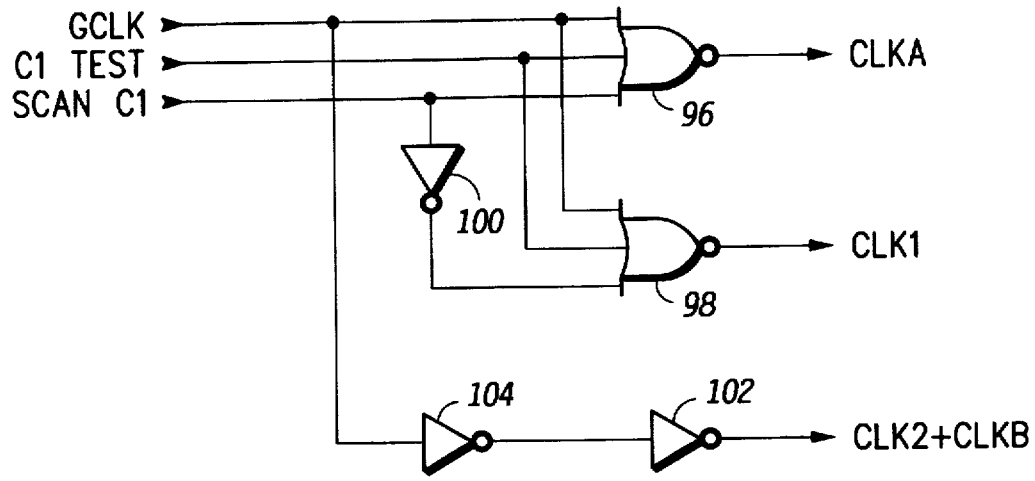
FIG. 5 depicts a schematic diagram of a first clock regenerator used to drive the latches depicted in FIGS. 2 and 3.

FIG. 5 depicts a schematic diagram of a first clock regenerator 94 used to drive the latches depicted in FIGS. 2 and 3. Typically, each instantiation of first clock regenerator 94 controls approximately twenty to thirty L1/L2 or L1* latches located nearby. Consequently, one instantiation of first clock generator 94 could control first latch 12, second latch 14, third latch 16, fourth latch 18, fifth latch 26, sixth latch 28, eighth latch 34, and ninth latch 36. First clock regenerator 94 generates the three clock signals CLKA, CLK1, and CLK2+CLKB, from the single clock input GCLK and the two control signals C1 TEST and SCAN C1. The clock signal GCLK is the global clock signal used to synchronize all clocked circuits in integrated circuit 10. The operation of the control signals C1 TEST and SCAN C1 are described below Not every class of latch needs every signal. In the preferred embodiment, unnecessary signals are not generated. In particular, first class of latch 38 and second class of latch 56 receive their SCANIN input at an input of each latches' master portion. Consequently, CLKB does not input SCANIN data to these classes of latches. However, it is the current convention in the industry to clock the slave portion of each latch during functional operation and test operation. The logic state of each slave portion is maintained by controlling the state of the corresponding master as described above. As a result, the clock signals CLK2 and CLKB are logically OR'ed together to comply with this design practice for the first class of latch 38 and second class of latch 56.

Continuing with FIG. 5, an output of a three-input NOR gate 96 generates the clock signal CLKA. A first input, a second input, and a third input of NOR gate 96 receive GCLK, C1 TEST and SCAN C1, respectively. An output of a three-input NOR gate 98 generates the CLOCK signal CLK1. A first input, a second input, and a third input of NOR gate 96 receive GCLK, C1 TEST and an output of an inverter 100, respectively. An input of inverter 100 receives the control signal SCAN C1. An output of an inverter 102 generates the clock signal CLK2+CLKB. An input of inverter 102 receives an output of an inverter 104. An in of inverter 104 receives the clock signal GCLK.

In the depicted embodiment, GCLK is distributed throughout integrated circuit 10 by an "H-tree." An H-tree is a skew minimizing interconnection scheme. In an H-tree, a clocking signal is routed to the four quadrants of a certain area by a conductive structure that resembles the capital letter H. The input to the H is through the center of the horizontal cross-piece and the outputs are the four points of the H. The geometrical symmetry of the letter H ensures that a signal propagates to the four points of the structure at the same time. Four smaller H's are connected to the four points of the first H. This process is repeated with smaller and more numerous H's until all synchronous circuits within integrated circuit 10 are physically close enough to receive the clocking signal from the extremity of some H with acceptable skew.

The control signals C1 TEST and SCAN C1 control the different modes of operation of the first type of latch 38 and the second type of latch 56. These control signals may be user-accessible for purposes of test control or may themselves be the output of a state machine. This latter case is typical of a BIST application. C1 TEST and SCAN C1 are "active low" signals. Therefore, they are "asserted" when they correspond to a low logic state. Conversely, they are "de-asserted" when they correspond to a high logic state. When the control signal C1 TEST=1, then CLKA and CLK1 remain in a low state. CLK2 pulses coincident with GCLK. This state is used to freeze the state of all latches. When the control signals C1 TEST=0 and SCAN C1=1, then CLK1 is the logical complement of GCLK. CLKA remains in a low state. This state is used to synchronize the transfer of data along the functional path of all latches. When the control signals C1 TEST=0 and SCAN C1=0, then CLKA is the logical complement of GCLK. CLK1 remains in a low state. This state is used to synchronize the transfer of data along the scan path of all latches.

Figure 6:
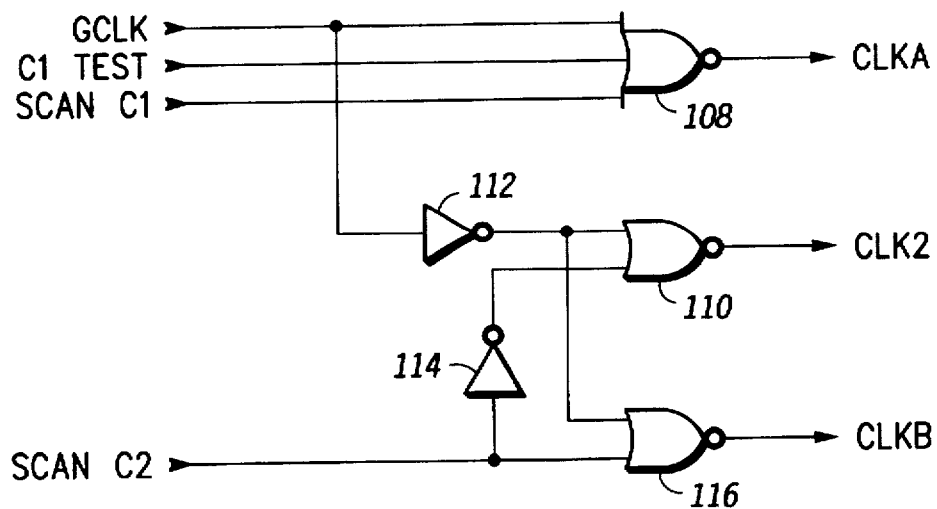
FIG. 6 depicts a schematic diagram of a second clock regenerator used to drive the latch depicted in FIG. 4.

FIG. 6 depicts a schematic diagram of a second clock regenerator 106 used to drive the latch depicted in FIG. 4. Each instantiation of second clock regenerator 106 controls approximately twenty to thirty *L2 latches located nearby. Second clock regenerator 106 generates the three clock signals CLKA, CLK2, and CLKB, from the single clock input GCLK and the three control signals C1 TEST, SCAN C1, and SCAN C2. The operation of the control signals C1 TEST, SCAN C1, and SCAN C2 are described below.

Again, not every class of latch needs every signal. Here, third class of latch 76 receives it's DATAIN input at an input of its slave portion. Consequently, CLK1 is not required.

Continuing with FIG. 6, an output of a three-input NOR gate 108 generates the clock signal CLKA. A first input, a second input, and a third input of NOR gate 108 receive GCLK, C1 TEST and SCAN C1, respectively. An output of a two-input NOR gate 110 generates the CLOCK signal CLK2. A first input and a second input of NOR gate 110 receive an output of an inverter 112 and an output of an inverter 114, respectively. An input of inverter 112 receives the control signal C1 TEST. An input of inverter 114 receives the control signal SCAN C2. An output of a two-input NOR gate 116 generates the CLOCK signal CLKB. A first input and a second input of NOR gate 110 receives the output of inverter 112 and the control signal SCAN C2, respectively.

The control signals C1 TEST, SCAN C1, and SCAN C2 control the different modes of operation of the third type of latch 76. SCAN C2 may be user-accessible for purposes of test control or may be the output of a state machine. SCAN C2 is also an active low signal. When the control signal C1 TEST=1 and SCAN C2=1, then CLKA and CLKB remain in a low state. CLK2 pulses coincident with GCLK. As described in connection with FIG. 5, CLK1 also remains low. This state is used to freeze the state of all latches. When the control signals C1 TEST=0, SCAN C1=1, and SCAN C2=1, then CLKA remains in a low state. CLK2 is logically equivalent to GCLK. As described in connection with FIG. 5, CLK1 is the logical complement of GCLK. This state is used to synchronize the transfer of data along the functional path of all latches. When the control signals C1 TEST=0, SCAN C1=0, and SCAN C2=0, then CLKA is the logical complement of GCLK and CLKB is logically equivalent to GCLK. This state is used to synchronize the transfer of data along the scan path of all latches. Other states are not used.

As described above, the LSSD methodology is a popular three/four clock test methodology. Therefore, it is desirable for the disclosed SSD methodology to be compatible with the LSSD methodology. LSSD requires that the functional clock and the test clock be fully non-overlapping; i.e. it must be possible to force both CLK1 and CLK2 to a low logic state and it must be possible to force both CLKA and CLKB to a low logic state. Also, it must be possible to force all four clock signals to a low state. In known test methodologies, CLKA and CLKB are separate clock signals accessible to the user. Consequently, it is a simple matter to disable both signals or to ensure that both are not high at the same time be applying the appropriate voltage levels to the input/output drivers of the circuit. CLK1 and CLK2 are guaranteed not to overlap by the way they are generated: each is a different phase of the global clock signal. A control signal disables CLK1 and CLK2 when necessary.

In the disclosed invention, the control signal C1 TEST allows the SSD methodology to emulate an LSSD design. Normally, C1 TEST equals a low logic state. When integrated circuit 10 is to be tested with an LSSD compliant methodology, then C1 TEST is strategically de-asserted. All clocks may be forced to a low state by forcing GCLK=0 and C1 TEST=1. This state is also referred to as the quiescent state.

First clock generator 94 generates three independent clock pulses from the quiescent state. It should be understood that first clock generator 94 returns to the quiescent state after each pulse. First, if C1 TEST is pulsed low, then CLKA pulses high. Second, if SCAN C1 and C1 TEST are pulsed low, then CLK1 pulses high. Third, if GCLK is pulsed high, then CLK2+CLKB pulses high.

Second clock generator 106 also generates three independent clock pulses from the quiescent state. Again, it should be understood that second clock generator 106 returns to the quiescent state after each pulse. First, if C1 TEST is pulsed low, then CLKA pulses high. Second, if SCAN C2 and GCLK are pulsed high, then CLK2 pulses high. Third, if SCAN C2 is pulsed low and GCLK are pulsed high, then CLKB pulses high.

Although the present invention has been described with a reference to a specific embodiment, further modifications and improvements will occur to those skilled in the art. For instance, there are different manufacturing technologies and design methodologies which alter the design of the various latches described above. It is to be understood therefore, that the invention encompasses all such modifications that do not depart from the spirit and scope of the invention as defined in the appended claims.

We claim:

1. A single clock scan design circuit for testing a synchronous circuit, the synchronous circuit comprising a plurality of latches, each one of the plurality of latches receiving a functional input and a scan input and generating an output, each one of the plurality of latches capturing the functional input responsive to the assertion of a first functional clock, each one of the plurality of latches capturing the scan input responsive to the assertion of a first test clock, each one of the plurality of latches launching captured data responsive to the assertion of a second functional clock, the single clock scan design circuit comprising:

first circuitry receiving a single clock and generating the first test clock therefrom responsive to at least one control signal;

second circuitry receiving the single clock and generating the first functional clock therefrom responsive to the at least one control signal; and third circuitry receiving the single clock signal and generating the second functional clock from the at least one control signal.

2. The single clock scan design circuit claim 1 wherein one of the plurality of latches is a *L2 further comprising:

fourth circuitry receiving the single clock and generating a second clock therefrom responsive to the at least one control signal.

3. An integrated circuit comprising:

a plurality of latches, each one of the plurality of latches receiving a functional input and a scan input and generating an output, each one of the plurality of latches capturing the functional input responsive to the assertion of a first functional clock, each one of the plurality of latches capturing the scan input responsive to the assertion of a first test clock, each one of the plurality of latches launching captured data responsive to the assertion of a second functional clock; and at least one first clock regenerator, the at least one first clock regenerator receiving a single clock and at least one control signal, the at least one first clock regenerator generating the first functional clock, the first test clock, and the second functional clock.

4. The integrated circuit of claim 3 further comprising:

at least one *L2 latch, the at least one *L2 latch capturing functional data responsive to a second test clock; and at least one second clock regenerator, the at least one second clock regenerator receiving the single clock and the at least one control signal, the at least one first clock regenerator generating the second test clock.

5. A method of testing an integrated circuit, the integrated circuit comprising a plurality of latches, each one of the plurality of latches receiving a functional input and a scan input and generating an output, each one of the plurality of latches capturing the functional input responsive to the assertion of a first functional clock, each one of the plurality of latches capturing the scan input responsive to the assertion of a test clock, each one of the plurality of latches launching captured data responsive to the assertion of a second functional clock, the method comprising the steps of:

during a first time, shifting a test vector into the plurality of latches by periodically asserting the test clock, the test clock generated from a single clock and at least one control signal;

during a second time, applying the test vector stored in the plurality of latches to logic, the outputs of the plurality of latches coupled to the plurality of latches;

during a third time, capturing an output ("captured output") from the logic by the plurality of latches by asserting the first functional clock, the first functional clock generated from the single clock and the at least one control signal; and during a fourth time, shifting out the captured output from the plurality of latches.

6. The method of claim 5 wherein the step of shifting a test vector comprises the step of:

periodically asserting the test clock and the second functional clock.

7. The method of claim 6 wherein the step of capturing an output comprises the step of:

periodically asserting the first functional clock and the second functional clock.

8. The method of claim 5 wherein the step of capturing an output comprises the step of:

periodically asserting the first functional clock and the second functional clock.

* * * * *

UNITED STATES PATENT AND TRADEMARK OFFICE
CERTIFICATE OF CORRECTION

PATENT NO. : 5,748,645

DATED : May 5, 1998

INVENTOR(S) : Craig C. Hunter et al

It is certified that error appears in the above-identified patent and that said Letters Patent is hereby corrected as shown below:

Column 9, line 45, after "design circuit", insert -of- . . .

Column 9, line 46, after "'L2", insert latch," . . .

Signed and Sealed this

Twenty-ninth Day of September, 1998

Attest:

BRUCE LEHMAN

*Attesting Officer*    *Commissioner of Patents and Trademarks*